United States Patent
Hu et al.

(10) Patent No.: US 8,122,388 B2
(45) Date of Patent: Feb. 21, 2012

(54) PHASE-SHIFTING MASKS WITH SUB-WAVELENGTH DIFFRACTIVE OPTICAL ELEMENTS

(75) Inventors: Bin Hu, Portland, OR (US); Vivek Singh, Portland, OR (US); Yan Borodovsky, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 497 days.

(21) Appl. No.: 12/316,085

(22) Filed: Dec. 9, 2008

(65) Prior Publication Data

US 2009/0100400 A1     Apr. 16, 2009

Related U.S. Application Data

(62) Division of application No. 11/242,165, filed on Sep. 30, 2005, now Pat. No. 7,512,926.

(51) Int. Cl.
G06F 17/50     (2006.01)
G03F 1/00      (2006.01)

(52) U.S. Cl. .............. 716/51; 716/52; 716/53; 716/54; 716/55; 716/56; 430/5

(58) Field of Classification Search .............. 716/51–56; 430/5
See application file for complete search history.

(56) References Cited

U.S. PATENT DOCUMENTS

| | | | |
|---|---|---|---|
| 5,812,629 A * | 9/1998 | Clauser | 378/62 |
| 6,459,462 B1 * | 10/2002 | Seraphim et al. | 349/73 |
| 6,563,566 B2 * | 5/2003 | Rosenbluth et al. | 355/67 |
| 6,785,879 B2 * | 8/2004 | Pierrat | 716/53 |
| 7,028,285 B2 | 4/2006 | Cote et al. | |
| 7,063,920 B2 | 6/2006 | Baba-Ali | |
| 7,165,234 B2 | 1/2007 | Pierrat | |
| 7,171,034 B2 | 1/2007 | Wu et al. | |
| 7,197,722 B2 | 3/2007 | Wong et al. | |
| 7,266,803 B2 | 9/2007 | Chou et al. | |
| 7,285,781 B2 | 10/2007 | Cao et al. | |
| 7,370,313 B2 * | 5/2008 | Noelscher et al. | 430/5 |
| 7,374,865 B2 | 5/2008 | Nyhus et al. | |
| 2005/0015233 A1 | 1/2005 | Gordon | |
| 2005/0146704 A1 | 7/2005 | Gruner et al. | |
| 2006/0248497 A1 | 11/2006 | Huang et al. | |
| 2006/0271894 A1 | 11/2006 | Arunachalam | |

(Continued)

OTHER PUBLICATIONS

Liu et al.; "Optimal binary image design based on the branch and bound algorithm"; Apr. 3-6, 1990; Acoustics, Speech, and Signal Processing, 1990. ICASSP-90., 1990 International Conference on; pp. 1877-1880 vol. 4.

(Continued)

*Primary Examiner* — Helen Rossoshek
(74) *Attorney, Agent, or Firm* — Blakely, Sokoloff, Taylor & Zafman LLP

(57) ABSTRACT

The present invention discloses a method of designing a set of two tiled masks, as well as, a mask including: a first tile, the first tile being transparent to a light, the first tile having a first characteristic linear dimension that is 15% or less of a wavelength of the light; a second tile, the second tile being transparent to the light, the second tile having a second characteristic linear dimension that is 15% or less of the wavelength of the light; and a third tile, the third tile being opaque to the light, the third tile having a third characteristic linear dimension that is 15% or less of the wavelength of the light.

8 Claims, 4 Drawing Sheets

U.S. PATENT DOCUMENTS

2007/0077500 A1 4/2007 Baidya et al.
2007/0224519 A1 9/2007 Sivakumar et al.
2007/0251172 A1* 11/2007 Cramer et al. .................. 52/384
2008/0010627 A1 1/2008 Muelders et al.
2009/0170012 A1* 7/2009 Hu et al. ........................... 430/5

OTHER PUBLICATIONS

Grobman et al.; "Reticle enhancement technology: implications and challenges for physical design"; 2001; Design Automation Conference, 2001. Proceedings; pp. 73-78.

* cited by examiner

PHASE-SHIFTING MASKS WITH SUB-WAVELENGTH DIFFRACTIVE OPTICAL ELEMENTS

CROSS REFERENCE TO RELATED APPLICATION

This is a Divisional application of U.S. patent application Ser. No. 11/242,165 filed on Sep. 30, 2005 now U.S. Pat. No. 7,512,926, therein.

BACKGROUND OF THE INVENTION

1. Field of the Invention

The present invention relates to semiconductor integrated circuit (IC) manufacturing, and more specifically, to a set of two phase-shifting masks with sub-wavelength diffractive optical elements and a method of designing such a set of two phase-shifting masks with sub-wavelength diffractive optical elements.

2. Discussion of Related Art

Improvements in photolithography have allowed higher density and faster speed to be attained in Integrated Circuits (ICs) by continually shrinking the devices in a chip. According to the Rayleigh criterion, the minimum Critical Dimension (CD) which can be resolved by an imaging tool, may be directly proportional to the wavelength of the light source and inversely proportional to the Numerical Aperture (NA) of the projection optics. However, diffraction may degrade the aerial image when the CD becomes smaller than the wavelength of the light used to expose a photoresist film on a wafer. The exposure light may include deep ultraviolet light with a wavelength of 248 nanometers (nm) or 193 nm.

Photolithography in the sub-wavelength regime will benefit from wavefront engineering using a resolution enhancement technique (RET), such as a phase-shifting mask (PSM), to achieve a sufficiently wide process latitude. Unlike a conventional binary mask, such as chrome-on-glass (COG), that only modulates amplitude of light, a PSM also modulates phase of the light to beneficially use destructive interference to mitigate the detrimental effects of diffraction.

An alternating phase-shifting mask (AltPSM) may help to pattern a feature with a small linewidth or critical dimension (CD), such as a gate length of a transistor for a device in the chip. AltPSM improves contrast between exposed and unexposed regions of the photoresist film by introducing a phase difference of 180 degrees between the light transmitted through adjacent clear apertures of the mask to force amplitude of light between the corresponding two images to zero.

However, even an AltPSM may be unable to provide sufficient pattern fidelity as the CD is scaled down. Consequently, a variety of techniques may be needed to enhance fidelity of the pattern printed on the wafer.

In particular, a technique known as optical proximity correction (OPC) may be used to modify the features in the patterns on the mask to compensate for variations and non-uniformities in the fabrication process for the layer of the chip.

When traditional OPC is applied to the design of the mask, certain sub-resolution assist features, such as serifs and anti-serifs, may be used to modify the edges of the product features. Other sub-resolution assist features, such as scattering bars, may also be added nearby to the product features.

Empirically-derived rules may be formulated for OPC to help define product features that otherwise cannot be reliably reproduced during manufacturing. However, as the features shrink in size, many conflicts may arise in applying the rules. Thus, a mask, such as a PSM with OPC, may become very complex to design.

Thus, what is needed is a set of two phase-shifting masks with sub-wavelength diffractive optical elements and a method of designing such a set of two phase-shifting masks with sub-wavelength diffractive optical elements.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

Figure 1:
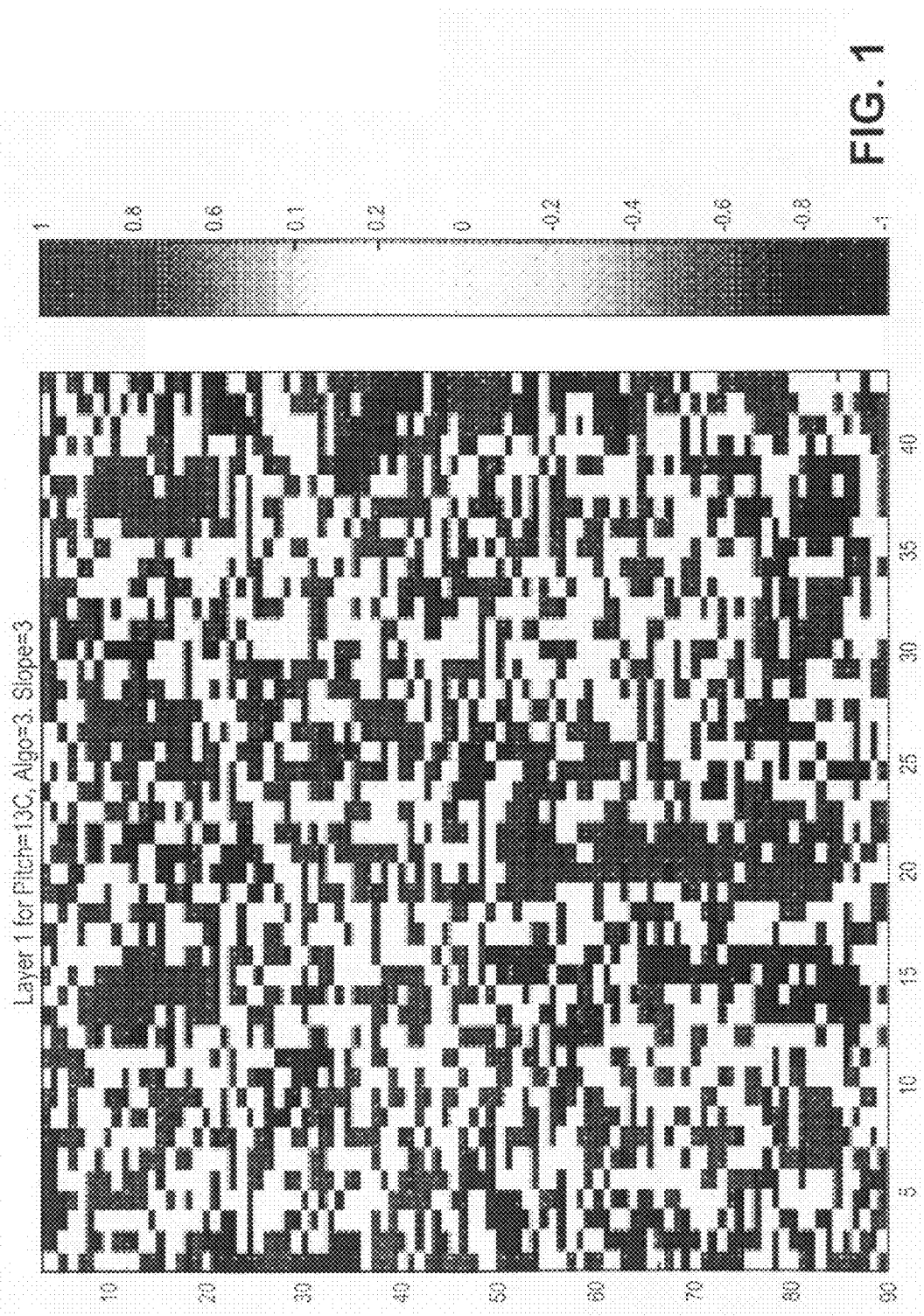
FIG. 1 is an illustration of a first tiled mask according to an embodiment of the present invention.
Figure 2:
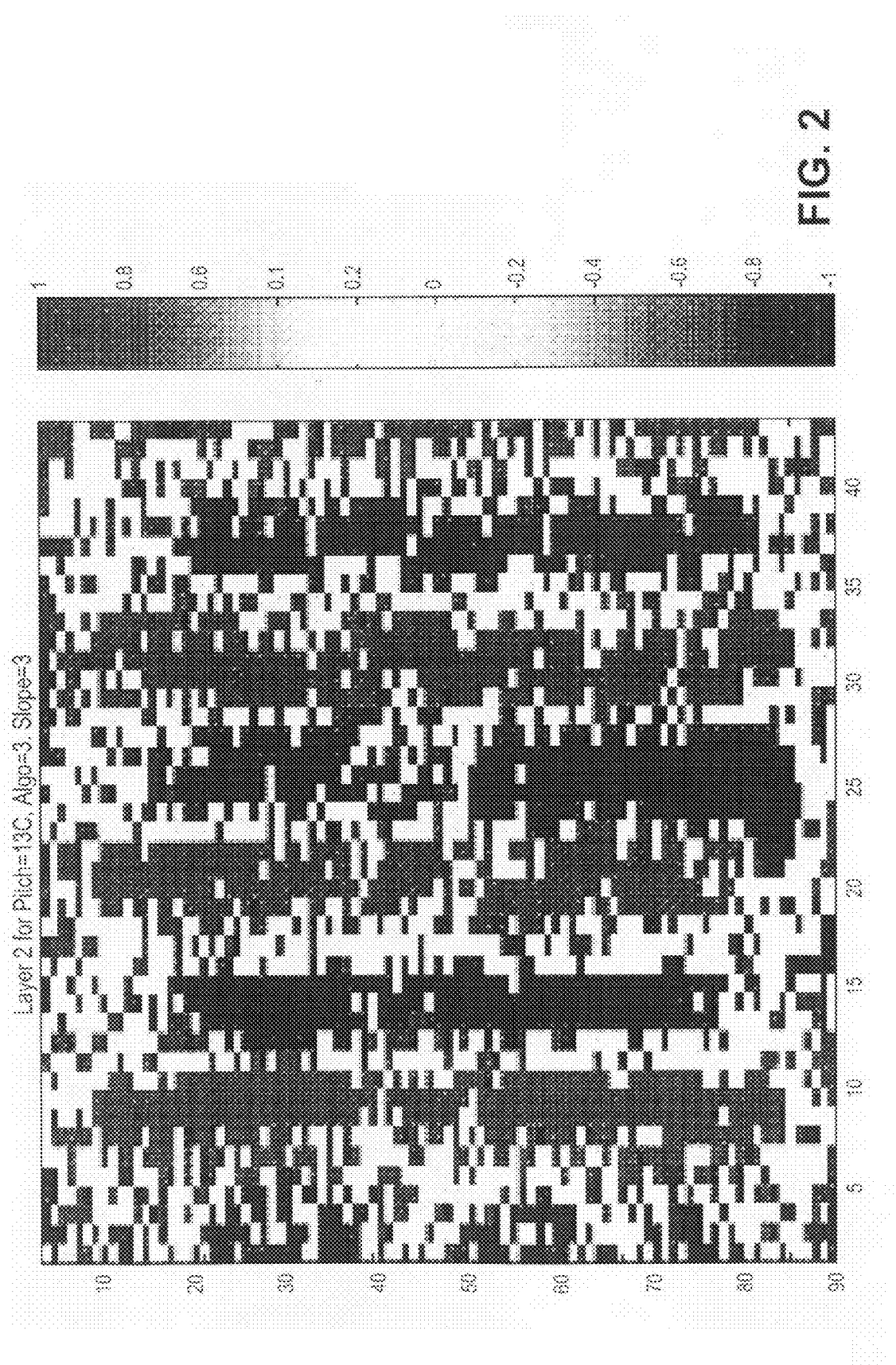
FIG. 2 is an illustration of a second tiled mask according to an embodiment of the present invention.
Figure 3:
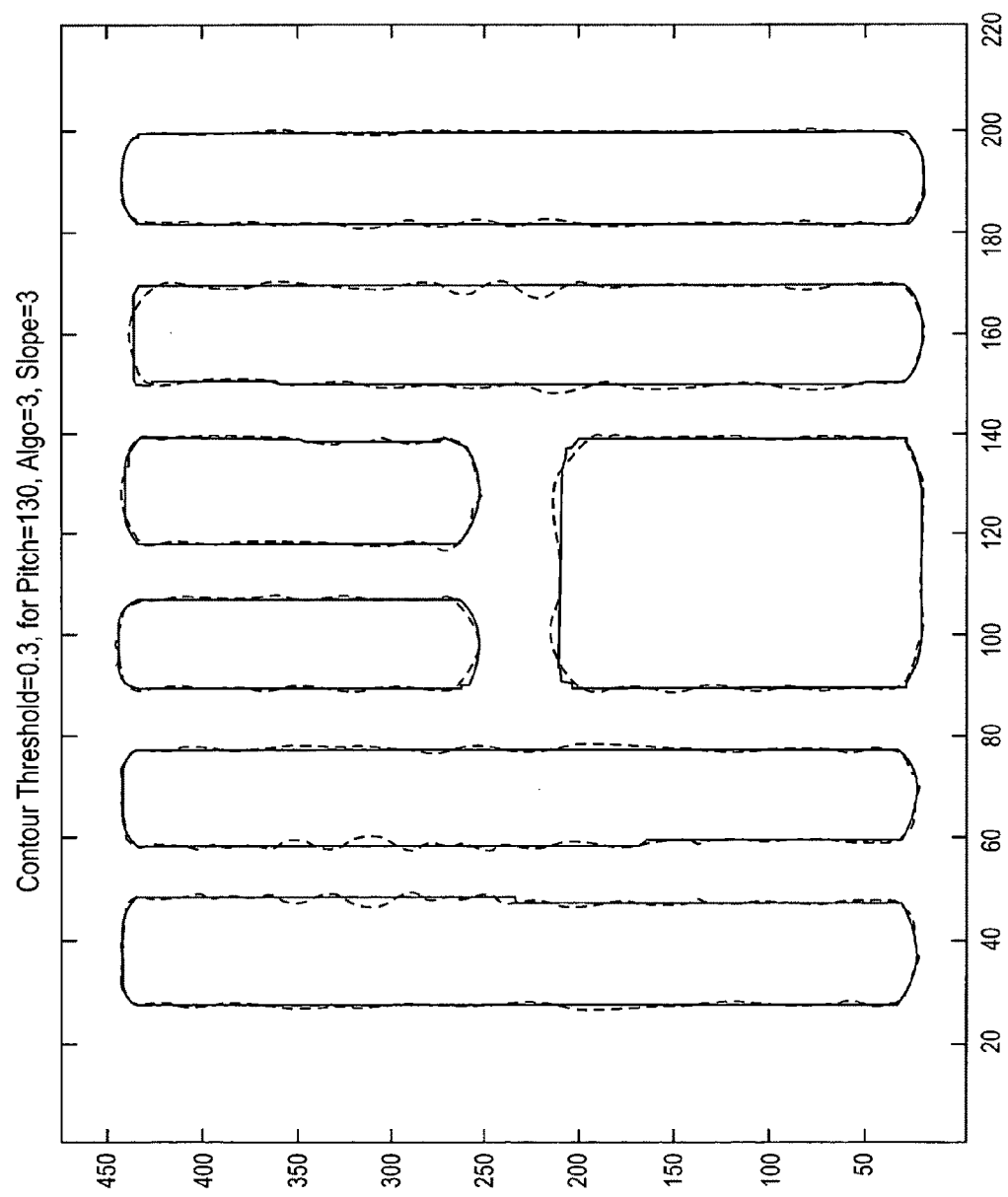
FIG. 3 is an illustration of simulated photoresist contour produced by exposure with two tiled masks according to an embodiment of the present invention.
Figure 4:
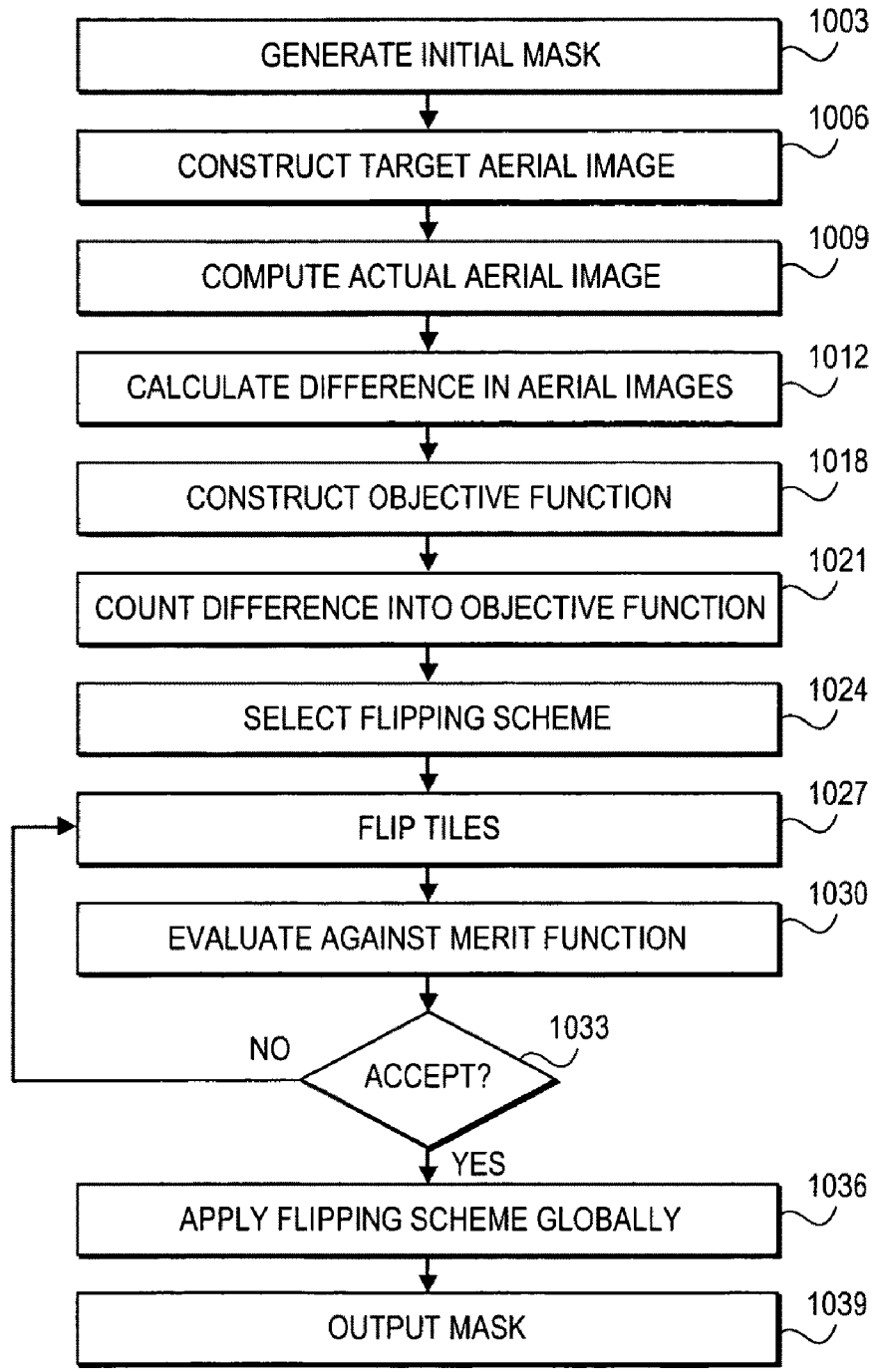
FIG. 4 is an illustration of a flowchart for designing a tiled mask according to an embodiment of the present invention.

The present invention describes a set of two tiled masks (embodiments shown in FIG. 1 and FIG. 2) for dual exposure of photoresist (embodiment shown in FIG. 3) with light and a method of designing such a set of two tiled masks (embodiment shown in FIG. 4). The light may have a wavelength of 248 nm, 193 nm, 157 nm, or 126 nm.

A tiled mask includes product features with sub-wavelength diffractive optical elements. In an embodiment of the present invention, the tiled mask may include a tiled binary mask (BIM) or a tiled chrome-on-glass (COG) mask. In an embodiment of the present invention, the tiled mask may include a phase-shifting mask (PSM). In an embodiment of the present invention, the tiled mask may include an alternating phase-shifting mask (AltPSM). In an embodiment of the present invention, the tiled PSM may include an attenuated phase-shifting mask (AttPSM).

In an embodiment of the present invention, the tiled mask may include a collection of contiguous tiles distributed across a geometrical plane and separated by boundary regions (frames) that may be distinct (separated) or common (shared). The frames may include a characteristic size, such as a width.

The tiles are arranged in an array or matrix to form product features on the mask. Each tile may include a characteristic shape. In an embodiment of the present invention, the shape may include a closed, two-dimensional shape, such as a polygon. In various embodiments of the present invention, the polygon may include a triangle, a square, a pentagon, or a hexagon. In an embodiment of the present invention, the polygon may be a regular polygon. In certain embodiments, the polygons may be adjusted or rotated as needed so they will interlock more neatly and reduce the size of the frames.

In an embodiment of the present invention, the product features may include edges that are predominantly oriented parallel to the x-axis, such as with a 0-degree or a 180-degree orientation, or the y-axis, such as with a 90-degree or a 270-degree orientation. Such so-called Manhattan geometry may be used for certain layers, such as layers corresponding to devices, such as transistors, or layers corresponding to interconnects.

In an embodiment of the present invention, certain product features may include diagonal edges, such as with a 45-degree or a 135-degree orientation. Such so-called X-architecture may be used for certain layers, such as layers corresponding to interconnects.

Each tile may include a characteristic linear dimension. In an embodiment of the present invention, the characteristic linear dimension may include a typical width (such as of a polygon) or an equivalent diameter (such as of an inscribed circle or a circumscribed circle).

In an embodiment of the present invention, the characteristic linear dimension of the tile is selected such that the area occupied by the smallest product feature to be designed on the mask will include a minimum number of tiles. In an embodiment of the present invention, the minimum number of tiles is 25.

In an embodiment of the present invention, the characteristic linear dimension of the tile is selected such that the smallest critical dimension (CD), such as the minimum linewidth, to be designed on the mask will include a multiple of the characteristic linear dimension of the tiles. In an embodiment of the present invention, the multiple is 5.

In an embodiment of the present invention, each tile may include multiple characteristic linear dimensions, such as a width and a length for a rectangle.

In an embodiment of the present invention, the tiles may include a characteristic linear dimension that may be 45% or less of the wavelength of light so that optical diffraction may predominate.

In an embodiment of the present invention, the tiles may include a characteristic linear dimension that may be 30% or less of the wavelength of light so that optical diffraction may predominate.

In an embodiment of the present invention, the tiles may include a characteristic linear dimension that may be 15% or less of the wavelength of light so that optical diffraction may predominate.

Adjacent tiles may be separated by one or more boundary regions (frames). The frames may be distinct or common. In an embodiment of the present invention, the frame size, such as width, may be uniform. In an embodiment of the present invention, the frame width may be variable. In an embodiment of the present invention, the frame width may be 5% or less of the characteristic linear dimension.

In an embodiment of the present invention, the frame width may be zero. In an embodiment of the present invention, the adjacent tiles may be frameless and butt each other. In an embodiment of the present invention, the adjacent tiles may be frameless and merge together.

Each tile may include a state. The state may include a phase and a transmittance with a Real part and an Imaginary part. The tile may modulate the phase and the transmittance of incident light. In an embodiment of the present invention, the various states may include different combinations of phase and transmittance. In an embodiment of the present invention, the phase may include discrete values. In an embodiment of the present invention, the transmittance may include discrete values.

The tiles may be transparent or translucent (designated as +1 or −1) such that most or some of the light is transmitted. Alternatively, the tiles may be opaque (designated as 0) so that most of the light is blocked. The transparent or translucent areas may either reverse the phase of the light as it passes through (−1) or leave the phase of the light unchanged (+1).

Once fabricated on a mask, the tiles may be transparent (such as formed from a quartz substrate), translucent (such as formed from a thin absorber, such as chrome or molybdenum silicide, overlying quartz substrate), or opaque (such as formed from a thick absorber, such as chrome, overlying quartz substrate).

In an embodiment of the present invention, an opaque tile has a transmittance of 0-1%. In an embodiment of the present invention, a translucent tile has a transmittance of 5-15%. In an embodiment of the present invention, a transparent tile has a transmittance of 95-99%.

A phase shift, such as of 180 degrees, may be created for a tile by forming a trench with an appropriate depth in the quartz substrate used for fabricating the mask.

In an embodiment of the present invention, the alternating PSM (AltPSM) may include three discrete states, such as (+1, 0, −1). The +1 state may be transparent, such as with 0 degree phase and 99% transmittance; the 0 state may be opaque, such as with 1% transmittance; and the −1 state may be transparent, such as with 180 degree phase and 99% transmittance.

In an embodiment of the present invention, the attenuated PSM (AttPSM), such as with a low transmittance, may include three discrete states, such as (+1, 0, −1.0). The +1 state may be transparent, such as with 0 degree phase and 99%, transmittance. The 0 state may be opaque, such as with 1% transmittance. The −1 state may be translucent, such as with 0 degree phase and 6% transmittance.

In an embodiment of the present invention, the attenuated PSM (AttPSM), such as with a high transmittance, may include three discrete states, such as (+1, 0, −1.0). The +1 state may be transparent, such as with 0 degree phase and 99%, transmittance. The 0 state may be opaque, such as with 1% transmittance. The −1 state may be translucent, such as with 0 degree phase and 12% transmittance.

In an embodiment of the present invention, the tiled mask may include tiles with a variable shape, a variable characteristic linear dimension, and a variable-width frame.

In an embodiment of the present invention, the tiled mask may include tiles with the same shape, the same characteristic linear dimension, and the same frame width. If all of the tiles have a characteristic linear dimension that is uniform, the resultant tiled mask may be represented as a matrix of rows and columns with each position in the matrix having a value of +1, 0, or −1.

FIG. 4 shows a flowchart for a tiled mask design process according to an embodiment of the present invention. The tiled mask design process begins with generating an initial tiled mask, such as a binary tiled mask, at box 1003.

A layout for an initial tiled mask may be generated by tiling a phase-colored drawn layout. For faster convergence toward the target pattern and therefore faster mask synthesis, the initial tiled mask should be as close to the target pattern as possible.

In an embodiment of the present invention, the initial tiled mask may be generated by phase coloring the drawn tiled mask layout using a phase coloring operation to assign different phases for neighboring tiles, such as polygons. Then, only the phase-conflicted tiles, such as polygons, are flipped. Flipping a tile means changing its value from one state to another state. Next, an actual aerial image is constructed and a merit function is evaluated. Finally, the coloring scheme corresponding to the minimum merit function value is selected as the initial condition.

A target aerial image may be constructed, at box 1006, such as by convolving the drawn layout with a square window function.

At box 1009, an actual aerial image is computed from the tiled mask that was determined from the flipping operation described above. The tile flipped matrix may be convolved with a kernel function to determine the electromagnetic (EM) field at all positions on the wafer that are exposed to light through the tiled mask. A square of the EM field is known as an intensity. If the intensity exceeds a certain threshold value then the portion of the photoresist over the wafer that is exposed to light will subsequently be developed away.

The kernel function depends on the wafer scanner with which the mask will be used. The kernel function may take into consideration the nature of the light source, any lens or filter between the light source and the tiled mask, the type of tiled mask that is to be used, the geometry of the environmental chamber around the wafer scanner, and the physical characteristics of the wafer that is to be processed.

Then, at box 1012, the difference between the actual aerial image, computed from the initial tiled mask, and the target aerial image is calculated.

An objective function based on a convolution is constructed at box 1018.

The difference between the actual aerial image and the target aerial image is counted into the objective function at box 1021, based on the evaluation location. The objective function is calculated by summing up all the differences from box 1012. The opaque regions and the clear (transparent and translucent) regions may receive different treatments in this operation.

Next, a tile-flipping scheme to flip a tile one-by-one or to flip multiple tiles as a block is selected at box 1024. A group of tiles flipped together may be denoted as a block flip.

Tile-flipping schemes include, but are not limited to, the following:

(a) different block sizes flipped with maximum size that is fixed;

(b) different block sizes flipped with maximum size that varies with iteration;

(c) random set of tiles flipped as a group;

(d) objective-weighted blocks flipped;

(e) context-weighted line block with maximum limit decreasing with iteration;

(f) context-weighted rectangular block with maximum limit decreasing with iteration;

(g) iterated initial conditions;

(h) single or block tile flipped with the center tile selected with random walk at every iteration;

(i) single or block tile flipped with the center tile selected with spiral walk starting from the center of the chip;

(j) single or block tile flipped with the selection order for the center tile dependent on its contribution to change in an objective function by the tile in the previous iteration;

(k) single or block tile flipped (as above) on a few selected masks that are selected based on the objective function from a population of masks created using the Genetic Algorithm (GA)-based principles of mutation and crossover of the masks from the previous iteration; and (l) tile flipped on a population of masks created by randomly flipping partitions of masks from the previous iteration, where partitions are formed by structures in the masks along with their neighborhood.

At box 1024, any one or more of the tile-flipping schemes described above may be selected. The selection of tile flipping schemes may be tailored to account for a variety of different constraints in manufacturing masks.

At box 1027, the tiles are flipped, either one at a time or in blocks, according to the selected tile-flipping scheme. Blocks of tiles are flipped at box 1027 according to a scheme that has been selected. The tile-flipping schemes may vary in traversal order, which determines the sequence of tiles to be flipped.

In sequential traversal order, the tiles to be flipped are selected in a deterministic order, such as by rows or columns, or such as x-wise or y-wise. Following a sequential traversal order may provide faster convergence for synthesizing the mask.

In random traversal order, the tiles to be flipped are determined randomly (or pseudo-randomly). Following a random (or pseudorandom) traversal order may provide a more global solution for synthesizing the mask.

In one embodiment, a small portion of the tiled mask is synthesized and the tile flipping at box 1027 is applied only to the tiles in that portion of the tiled mask. The particular tiles to be flipped depend on the tile-flipping scheme that is selected. If the selected tile-flipping scheme works well in that portion of the tiled mask, then it may be applied to the rest of the tiled mask. Working on just a small portion of the tiled mask permits a quicker determination of a good tile-flipping scheme or a good combination of tile-flipping schemes. The tile-flipping schemes are selected with an aim to achieve a faster convergence of the mask synthesis with the target aerial image so that the scheme may be applied to the entire mask.

At box 1030, the synthesized mask after one or more tiles are flipped is evaluated against a merit function. Conventional merit functions may be used or the function may be weighted.

In one embodiment, through-focus behavior for the wafer in the wafer scanner may be taken into account. The through-focus behavior depends on the accuracy of the focusing system for the wafer scanner used in producing wafers. Since the automatic focusing system cannot ensure that light will be perfectly focused on the wafer during production, the image of the tiled mask on the wafer may be blurred.

A through-focus merit function may be calculated for a synthesized mask as a weighted summation of individual merit functions at discrete focus points. The weights may be distributed through focus in a uniform way, or in a Gaussian distribution, or in other ways depending on the wafer scanner and the accuracy required.

Another effect which may be compensated for in the merit function evaluation includes a thick-mask effect. When the tiled mask is very thick compared to the wavelength of the exposure light, the light may be diffracted as it passes through the mask. In an embodiment of the present invention, a mask coating may be approximately 100 nanometers (nm) thick, while the light may have a wavelength of 248 nm, 193 nm, 157 nm, or 126 nm.

In an embodiment of the present invention, the merit function is calculated based on a synthesized mask that takes multiple effects into consideration. Other effects not described herein may be accommodated. The tiled mask may be synthesized in a variety of different ways for comparison with the target image. An approach is to calculate only the changes from the last tiled synthesized mask.

Based on the application of the merit function, the synthesized tiled mask is either rejected or accepted at box 1033. If the synthesized tiled mask is rejected, then the flow returns to box 1027 to flip another block of tiles.

However, once the synthesized tiled mask is accepted, the selected tile flipping scheme is applied globally to the entire mask at box 1036.

Then, a final tiled mask is output at box 1039. The tiled mask may be used for photolithography to produce Integrated Circuit (IC) devices on a chip.

In an embodiment of the present invention, accuracy may be enhanced by making separate exposures with multiple tiled masks. As shown in an embodiment of the present invention in FIG. 1 and FIG. 2, a set of two tiled masks may be designed and used. Dual exposure may produce photoresist contour as shown in an embodiment of the present invention in FIG. 3.

Dual tiled phase-shifting masks (PSMs) permit greater flexibility in designing the tiled masks by decoupling certain aspects of the features in a pattern to be printed. In an embodiment of the present invention, a set of masks may include a mask 1 and a mask 2.

The dual PSMs should work together to accomplish at least four functions: (i) print critical features in the pattern; (ii) print non-critical features in the pattern; (iii) protect desirable portions of the critical features and the non-critical features that have been printed; and (c) remove artifacts that have been unavoidably printed.

The initial design layout for dual exposure is generated by calculating the complex near-field mask transmission for a binary mask at a numerical aperture (NA) that is twice of the NA of the imaging tool, such as the wafer scanner, that will be used to pattern the wafer. The computed complex mask transmission will be split into two databases which correspond to the Real part and the Imaginary part of the complex mask transmission.

Next, those features that may share a common phase in each of the two masks are divided into tiles. The tiles have characteristic linear dimensions that are smaller than the wavelength of the light to be used in the imaging tool to expose photoresist coated on wafers. The tiles may be flipped to change their states so that the phase and the transmission may be changed as needed.

The initial mask synthesis includes the following procedure to rapidly determine a near-optimal solution. First, the states of the tiles at the same location on both mask 1 and mask 2 are changed. Second, the merit function is evaluated. Third, the changes are kept if the value of the merit function is reduced. Two to three iterations for all of the tiles may be used to find a near-optimal solution.

After the near-optimal solution has been found, the following procedure may be used to refine (or fine-tune) the solution. First, a certain traversal order is followed to change the state of a tile at a certain location on mask 1. Second, the merit function is evaluated. Third, the changes are kept if the value of the merit function is reduced. Next, the same procedure is followed on the corresponding tile on mask 2. First, the same traversal order is followed to change the state of a tile at the same location on mask 2. Second, the merit function is evaluated. Third, the changes are kept if the value of the merit function is reduced. Two iterations for all the tiles may be used.

Towards the end of mask synthesis, the following procedure may be used to ensure that the solution is optimal. The single-exposure tiling procedure is used to optimize mask 1 while mask 2 is held constant. After that, the single-exposure tiling procedure is used to optimize mask 2 while mask 1 is held constant. Two iterations between mask 1 and mask 2 may be used.

During mask synthesis, the registration alignment error between the dual tiled masks may be reduced by using the following procedure. As measured with the merit function, the contour fidelity changes, due to edge movements and tile flipping, are calculated and weighted to generate a combined objective function. The objective function may then be used to balance the sensitivity of registration alignment error between the two tiled masks and tile flipping.

An embodiment of the present invention encompasses an apparatus, such as an integrated system made up of various components, for designing the set of one or more tiled masks by using:

(1) a method to determine the initial layout for the set of tiled masks that may be as close as possible to the optimal solution;

(2) a convolution-based objective function to evaluate the merit of a tiled mask;

(3) a variety of schemes to determine how to flip a group of tiles (block-flip) to achieve fast convergence of mask synthesis and globality of the solution;

(4) a method to perform constrained tile optimization, to take into account tiled mask manufacturing limitations;

(5) a tile traversal order, such as a sequential traversal order or a random traversal order, to determine the sequence of tiles to be optimized;

(6) a method to synthesize the tiled mask for optimal through-focus behavior;

(7) a mask model, such as a thick-mask model, to compute the diffracted EM fields resulting from the tiled mask; and (8) an imaging model, such as a pertubative imaging model.

The tiled mask optimization process may include the integrated system described above. In an embodiment of the present invention, one or more of the components described above may not be necessary. In an embodiment of the present invention, other components not described above may be included. In an embodiment of the present invention, one or more of the components should be selected to produce a fast and accurate design, such as of dual tiled masks.

An embodiment of the present invention, such as the integrated system made up of various components, may be provided as a computer program product which may include a machine-readable medium having stored thereon instructions which may be used to program a computer or other electronic device to perform a process.

The machine-readable media may include, but are not limited to, nonvolatile media, such as magnetic or optical disks, volatile media, such as dynamic memory, and transmission media, such as coaxial cables, copper wires, or fiber optics. Transmission media may also take the form of acoustic waves or light waves, such as those generated during radio-wave or infra-red data communication.

Common forms of machine-readable media include floppy diskettes, hard disks, magnetic tapes, optical disks, magneto-optical disks, CD-ROMs, RAMs, ROMs, PROMs, EPROMs, EEPROMs, flash memory, magnetic or optical cards, memory sticks, and USB flash drives.

An embodiment of the present invention may be downloaded as a computer program product, wherein the program may be transferred from a remote computer to a requesting computer by way of data signals embodied in a carrier wave or other propagation medium via a communication link, such as a modem or a network connection.

The present invention may be implemented on a computer that includes a communication means, such as a bus, for communicating information, and a processing means, such as a microprocessor, coupled to the bus for processing information.

The computer includes a main memory, such as a random access memory (RAM) or other dynamic storage device, coupled to the bus for storing information and instructions. The main memory is used for storing temporary variables or other intermediate information during execution of instructions by the processor.

The computer includes a nonvolatile memory, such as a read only memory (ROM) or other static storage device, coupled to the bus for storing information and instructions to be executed by the processor.

A mass storage device, such as a magnetic disk or optical disc and its corresponding drive, is coupled to the bus for storing information and instructions.

A display device, such as a cathode ray tube (CRT) monitor or a liquid crystal display (LCD) monitor, is coupled, via the bus, to the computer for displaying information to a user. Graphical and textual indications of installation status, operations status, and other information is presented to the user on the display device.

A user input device, such as a keyboard, including alphanumeric, function, and other keys, is coupled to the bus for communicating information and command selections to the processor.

A cursor control, such as a mouse, a trackball, or cursor direction keys, is coupled to the bus for communicating direction information and command selections to the processor and for controlling cursor movement on the display.

A communication interface, such as a modem, a network interface card, is coupled to the bus. The communication interface provides a two-way communication coupling to an Ethernet, a token ring, or other type of network link for connecting to other devices via a network, such as a local area network (LAN) or a wide area network (WAN). The computer may be coupled to clients or servers or a host computer via a network infrastructure, such as an intranet or the Internet.

A wireless link may also be implemented in which the communication interface sends and receives electrical, electromagnetic, or optical signals that carry analog or digital data streams representing various types of information.

The computer may send and receive data, including program code, through the communication interface, the network link, and the network.

It is to be appreciated that a lesser or more equipped computer than described above may be used for certain implementations. The configuration may vary depending upon certain factors, such as price constraints, performance requirements, or technological improvements.

Embodiments of the present invention may be applied to other types of tools, including wafer scanners, which may use different materials and devices than those shown and described herein.

It is further to be appreciated that a lesser or more complex aerial image, tile function set, merit function, comparison process, and new mask determination than those shown and described herein may be used.

Multiple embodiments and specific details have been set forth above to provide a thorough understanding of the present invention. One skilled in the art will realize that certain of the features in one embodiment may be equally applicable to other embodiments. One skilled in the art will also appreciate the ability to make other equivalent substitutions for those specific materials, processes, dimensions, and concentrations described herein. In other instances, well-known circuits, structures and techniques have not been shown in detail to avoid obscuring the understanding of this description. It is to be understood that the detailed description of the present invention should be regarded as illustrative and not limiting, wherein the scope of the present invention should be determined by the claims that follow.

Thus, we have described a set of two tiled phase-shifting masks and a method of designing such a set of two tiled phase-shifting masks.

We claim:

1. A machine-readable non-transitory medium containing instructions, which when operated on by the machine, causes the machine to perform a method of designing a set of two tiled masks for a dual exposure lithography operation, the method comprising:
    calculating a complex mask transmission at a numerical aperture (NA) that is twice the numerical aperture of an imaging tool to be used with said two tiled masks;
    splitting said complex mask transmission into a real part and an imaginary part;
    dividing, into tiles, product features that will share a common phase in each of the two tiled masks;
    following a traversal order to flip tiles to be at same locations on both tiled masks until a value of a merit function is reduced; and
    as measured by said merit function, calculating and weighting contour fidelity changes, due to edge movements and tile flipping, to generate a combined objective function, wherein said combined objective function may be used to balance sensitivity of said registration alignment error between said two tiled masks and said tile-flipping; and
    using a method to design each of the tiled masks which optimizes each of the tiled masks while holding the other of the tiled masks constant.

2. The machine-readable non-transitory medium of claim 1 wherein said traversal order comprises a sequential traversal order.

3. The machine-readable non-transitory medium of claim 1 wherein said traversal order comprises a random traversal order.

4. The machine-readable non-transitory medium of claim 1 wherein said phase comprises 0 degree or 180 degrees.

5. The machine-readable non-transitory medium of claim 1 wherein said complex mask transmission comprises transparent, translucent, or opaque states.

6. The machine-readable non-transitory medium of claim 1 wherein said tiles comprise a characteristic shape of a regular polygon.

7. The machine-readable non-transitory medium of claim 1 wherein said tiles have a characteristic linear dimension that is smaller than a wavelength of a light to be used in said imaging tool.

8. The machine-readable non-transitory medium of claim 1 wherein said machine comprises a computer, said computer comprising:
    a bus;
    a processor coupled to said bus;
    a main memory coupled to said bus;
    a nonvolatile memory coupled to said bus;
    a mass storage device coupled to said bus;
    a display device coupled to said bus;
    a user input device coupled to said bus;
    a cursor control coupled to said bus; and
    a communication interface coupled to said bus.

* * * * *